SEMICONDUCTOR DEVICE AND METHOD

Filed May 18, 1961 2 Sheets-Sheet 1

KURT HUBNER
*INVENTOR.*

*BY* Flehr and Swain
ATTORNEYS

Oct. 13, 1964 K. HUBNER 3,152,928

SEMICONDUCTOR DEVICE AND METHOD

Filed May 18, 1961 2 Sheets-Sheet 2

KURT HUBNER
*INVENTOR.*

*BY* Fleher and Swain

ATTORNEYS

United States Patent Office 3,152,928
Patented Oct. 13, 1964

3,152,928
SEMICONDUCTOR DEVICE AND METHOD

Kurt Hubner, Palo Alto, Calif., assignor to Clevite Corporation, a corporation of Ohio Filed May 18, 1961, Ser. No. 110,991
8 Claims. (Cl. 148—33.5)

This invention relates generally to semiconductor devices and a method of making the same and more particularly to large area semiconductor devices capable of high speed switching operation and also to low capacitance semiconductor switching devices.

Semiconductor devices having four layers with contiguous layers of opposite conductivity type to form three junctions are known in the prior art. Devices of this type may be employed as voltage responsive devices. When the voltage across the device is increased beyond a switching value, the device switches from a relatively high impedance state to a relatively low impedance state and remains in the low impedance state until the current through the device is reduced below a holding value.

The device operates in substantially the following manner. As the voltage across the device is increased, the electric field across the center junction reaches a value sufficient to cause avalanche multiplication. The multiplication is started with charged carriers thermally generated in the space charge depletion layer produced by the field at the junction.

The carrier multiplication and the resulting current flow induces minority carrier injection from the adjacent outer or "emitter" junctions, flooding the two center layers, each of which may be regarded as the base layer of a three layered structure, with minority carriers. This minority carrier injection increases the current transfer ratio alpha in the base layer until saturation and turn-on occurs. The center junction is switched to a forward bias or "on" condition.

The voltage across the device then reduces from the maximum value which is determined by the avalanche voltage of the center junction to a much lower value which is equal to the voltage drop across the forward biased silicon junctions plus the resistive drop in the device's contact and terminal leads.

The device then remains in this low impedance condition until the current is reduced below a holding value, a value in which the sum of the alphas decreases below unity, at which point the device switches back to its high impedance state.

The switching voltage and holding current characteristics of the device are dependent upon the impurity concentration and thickness of the various layers. In general, the switching voltage is increased by reducing the unbalanced charge density at the center junction.

When devices of this type are constructed to handle relatively large currents (power), they are made with large cross-sectional area. When a device is designed for a particular breakdown voltage, it is often found that the actual breakdown voltage is substantially lower. It is surmised that this is due to the lateral inhomogeneity across the area of the reverse biased center or switching junction. The inhomogeneity produces small localized areas or regions which have a lower breakdown voltage than the remainder of the center junction, thus, in essence, controlling the breakdown voltage of the center junction.

These localized regions may be caused by statistical variations of the concentration of donor and acceptor atoms distributed at random across the junction, by defects known as dislocations, by metal precipitates such as iron, copper or manganese, by oxygen or silicon oxide precipitates within the device, non-uniform doping which may occur during the diffusion process, by surface conditions, or by a combination of these.

These non-uniform characteristics will most seriously effect the performance of the semiconductor devices which operate at avalanche. In addition to four layer diodes, such devices may include avalanche transistors and avalanche voltage regulators or zener diodes.

If there is a localized spot in the avalanche junction in which the breakdown voltage is materially lower, this spot will initially carry most of the current and continue to carry this current unless the voltage drop is built up across its series resistance high enough to bring other portions of the junction into avalanche. Such defects might produce excessive local current densities and cause burn-out of the device.

It has been found that if the switching voltage is approached slowly, the device will turn on at the point of the lowest breakdown and the design avalanche voltage may never be reached. In this situation, uniform turn-on may eventually be achieved by subsequent spreading of minority carriers through diffusion.

It is preferable, however, to bring the device up to switching voltage by a fast rising voltage pulse. It is then possible to overshoot the lower avalanche voltage and bring the entire junction area up to avalanche or switching voltage before the localized spot can turn on. Still, the design breakdown voltage may never be reached. The various localized spots may give a breakdown voltage which is substantially less than the design voltage.

As explained above, localized breakdown must spread. This requires a finite time and reduces the switching speed.

Thus, not only is the breakdown voltage lowered by the localized breakdown region but the switching time is increased. Further, of course, as described above, the spreading may never take place with the localized regions having extremely high localized currents which burn out the device.

It is a general object of the present invention to provide an improved semiconductor device and method of making the same.

It is another object of the present invention to provide an improved large area semiconductor switching device in which the breakdown or switching voltage can be controlled within predetermined narrow limits.

It is a further object of the present invention to provide a large area device which is capable of high speed switching.

It is still a further object of the present invention to provide a large area semiconductor switching device in which the majority of the area is designed for high switching voltage with small localized regions or firing pins designed for lower breakdown voltages whereby they control the breakdown voltage of the device and reduce the probability that localized regions in the high voltage portion will control the characteristics.

It is still another object of the present invention to provide a semiconductor switching device of the above character which has relatively low capacitance whereby when used in such circuits as telephone switching circuits, the cross-talk is substantially reduced.

These and other objects of the invention will become more clearly apparent from the following description when taken in conjunction with the accompanying drawing.

Referring to the drawing.

Figure 1:
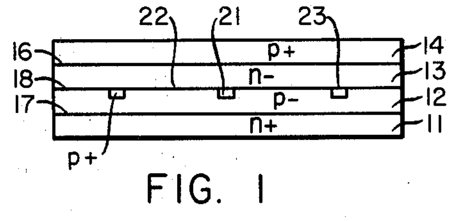
FIGURE 1 is a sectional view of a device in accordance with the invention taken along the line 1—1 of FIGURE 2.

FIGURES 3A–F show the steps in constructing a device of the type shown in FIGURE 1;

FIGURES 4A–H shows the steps in constructing another device in accordance with the present invention; and FIGURES 5A–I show the steps of constructing still another device in accordance with the present invention.

Figure 2:
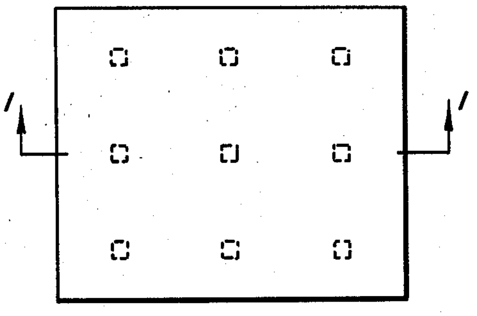
FIGURE 2 is a plan view of a device in accordance with the present invention.
Figure 3:
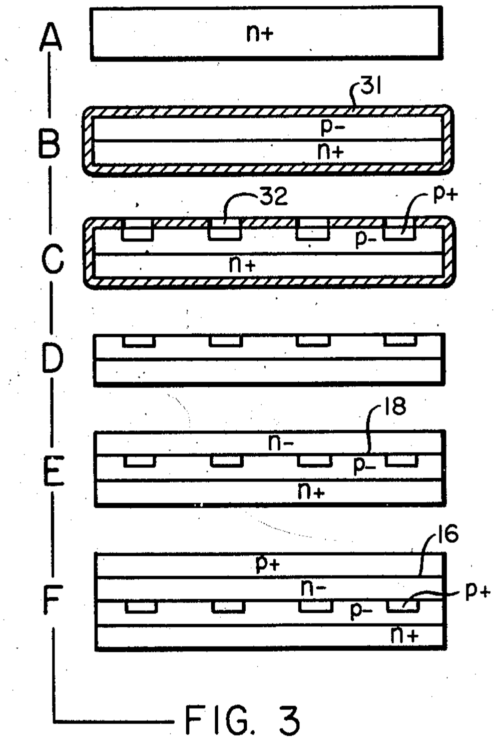

Referring to FIGURES 1 and 2, the device illustrated is a four layer semiconductor switching device having four successive regions or layers 11, 12, 13 and 14 forming outer or "emitter" junctions 16 and 17, and a center or "collector" junction 18. In the device illustrated, the regions of semiconductor material are n+, p−, n− and p+, respectively. The center junction is provided with localized areas or regions 21 which have a higher concentration of unbalanced charges on at least one side within the space charge layer than the remainder of the layer. These localized regions will control the breakdown or switching voltage of the device.

The regions may, for example, be formed by insetting relatively small regions of semiconductive material of higher impurity concentration than the surrounding material at the junction. The p+ region 21 in the p− layer 12 may have an area across the junction of $2.5\times10^{-5}$ $cm.^2$ with a spacing of 0.1 cm. whereby they occupy 0.25% or less of the total area across the device. Processes for forming such inset regions will be presently described.

The device will then have regions 22 in which the center junction has a relatively high avalanche voltage and regions 23 which have relatively low avalanche voltage. As a result, the regions 23 of the center junction will control the breakdown voltage. The large number of such regions spaced over the area of the junction will control the breakdown voltage. When these regions are at breakdown, the breakdown will spread over the entire device permitting handling of relatively large currents.

For example, for a 50 volt switching device, the center junction in the region 22 may be made so that it will have a breakdown or avalanche voltage of 1000 volts or more, whereas the region 23 will be constructed to have a breakdown voltage of 50 volts.

By making the total area of all the pins considerably less than the entire cross-sectional area of the structure, and by providing a relatively high avalanche voltage in the surrounding regions, a much smaller spread of breakdown voltage from one region 23 to another region 23 can be expected from spot to spot in a homogeneous structure of the same total area and breakdown voltage. The foregoing can be proved on a statistical basis.

It is, therefore, possible to reach or exceed the breakdown voltage of all the pins to turn them on simultaneously as, for example, by pulsing and yet not reach the breakdown value of any localized spots in the higher voltage region. Since the pins are regularly spaced, only a limited spreading of current is necessary to turn on the entire device. The likelihood that the device will burn out due to excessive localized currents will be minimized. Furthermore, the probability that the design breakdown voltage is achieved is substantially increased. Because of the close spacing of the "firing pins," the spreading required is minimized. The switching speed is consequently increased.

The device will operate more uniformly over its entire cross-sectional area with pulsed operation as described above since all of the regions 23 will be turned on simultaneously. However, the probability that even with slow rising voltages, the device will turn on uniformly will be considerably increased.

Referring now to FIGURES 3A–F, the steps in forming the device of FIGURE 1 are shown. Thus, an n+ wafer of semiconductive material is masked and subjected to a diffusion in the presence of acceptor atoms to form a p− layer, FIGURE 3B. During the diffusion operation, an oxide layer 31 is formed on the surface. The p− layer may also be formed by epitaxial growth with a subsequent treatment to form the oxide layer 31. This layer is suitably masked by an acid resistive coating, such as photo-resist, and the device is then etched to remove the exposed oxide to provide a plurality of windows 32. A subsequent diffusion in the presence of a higher concentration of acceptor atoms will form p+ insert regions at the window 32, FIGURE 3C. The device is subsequently cleaned and the structure shown in FIGURE 3D results. The device is then subjected to an epitaxial growth of an n− layer to thereby form the collector junction 18, FIGURE 3E. A diffusion or an epitaxial growth forms the p+ layer to thereby provide the junction 16, FIGURE 3F.

The resulting device is of the type shown in FIGURE 1 and operates to switch at a voltage determined by the unbalanced charges at the junction 18 in the region 23. The junction formed in the above illustration is a step junction. However, it will be observed that if step 3E were a diffusion rather than an epitaxial growth, the junctions would be graded junctions. The device would still operate in the manner discussed above.

Figure 4:
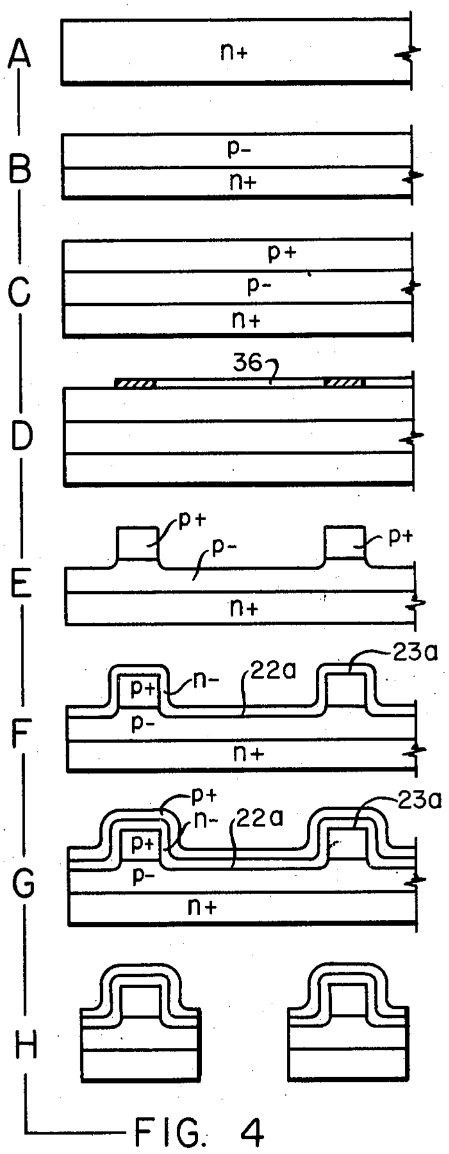

FIGURES 4A–H show another method of forming a device having lower voltage (firing pin) areas in accordance with the invention. Thus, in FIGURE 4, an n+ starting wafer is illustrated. The wafer is subjected to a diffusion operation to form a p− layer, FIGURE 4B. Subsequently, an overlying p+ layer is formed. The operation of FIGURE 4C may be either a diffusion or an epitaxial growth as desired. The device is masked to form a plurality of windows 36 and subjected to an etching operation whereby the material is etched beyond the region from p− to p+ to thereby form a plurality of p+ islands on one surface such as shown in FIGURE 4E.

The next step is a diffusion step to form an n− layer overlying the upper surface whereby there is formed a relatively high voltage junction between the n− and p− layers, region 22*a*, and a relatively low voltage junction between the p+ layer and the adjacent n− layer, region 23*a*. The latter will control the characteristic voltage of the device. A subsequent diffusion will form a p+ layer and connections can be made as desired to the outer layers. Again, there is provided a device having a high breakdown voltage region and controlled breakdown or firing regions.

A further advantage with the device described is that the capacitance of the device is considerably reduced since only a small region of the device has a low voltage high capacitance center junction. The high voltage portions of the center junction have a relatively low capacitance because of the low charge density at the junction and occupy a large percent of the total area thereby essentially controlling the capacitance. The device can be diced to form a plurality of individual devices each having an island or breakdown region surrounded by a high voltage or "guard" region, FIGURE 4H. Devices of this type are relatively insensitive to surface conditions since the low voltage region is protected from the surrounds. The capacitance is small since the largest proportion of the device is high voltage.

Figure 5:
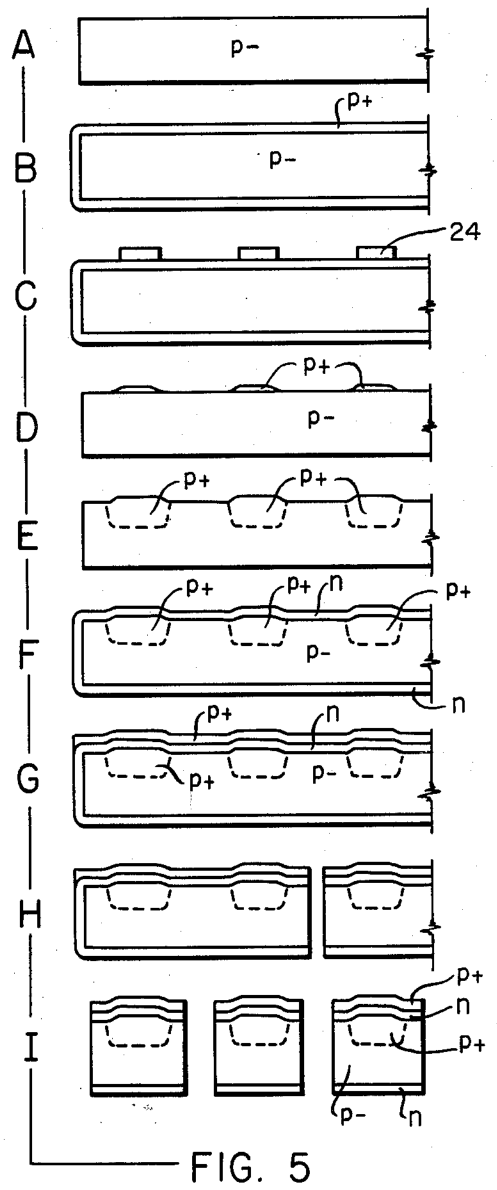

Referring to FIGURE 5, there is shown another method of forming a device in accordance with the invention. In FIGURE 5, there is shown a segment of a wafer of p-type semiconductive material. The wafer is subjected to a predeposition of boron to form a thin predeposit layer of p-type material. The predeposited wafer is masked as, for example, by applying wax dots 24, FIGURE 5C. The wafer is then subjected to an etching operation to remove the surface layer in all portions except under the wax dots. The mask is removed to give a wafer of the type shown in FIGURE 5D. A subsequent diffusion at relatively high temperatures diffuses the boron impurities inwardly into the p− region to form p+ inserts as indicated in FIGURE 5E. Subsequently, the device is subjected to an n-type diffusion to form upper and lower n-type diffusion layers which form a high voltage junction with the underlying p− layer and a relatively low voltage junction with the p+ insets, FIGURE 5F. The wafer is then masked and an additional diffusion operation forms an upper p+ layer indicated in FIGURE 5G. Subsequently, the wafer is cleaned and diced in predetermined areas as shown in FIGURE 5H. If desired to form individual devices, the wafer is further diced as shown in FIGURE 5I to form devices having a single firing pin surrounded by a high voltage junction.

The device characteristics can be closely controlled by controlling the relatively small regions with the probability of achieving the desired voltage characteristics substantially increased. For higher power, a device having a plurality of islands may be employed, which device will then have a breakdown voltage which is determined by the low voltage regions and a capacitance which is determined substantially by the high voltage portion. A low power semiconductor device having low capacitance can be formed by dicing to give a single firing pin device.

I claim:

1. A semiconductor device having at least first and second contiguous regions of semiconductive material of opposite conductivity type forming a rectifying junction, at least one of said regions having at the junction a plurality of spaced isolated localized areas having a higher concentration of unbalanced charges than the remainder of the region whereby the junction formed at said isolated localized areas has a characteristic reverse breakdown voltage which is substantially below the characteristic reverse breakdown voltage of the remainder of the junction whereby said areas determine the characteristic reverse breakdown voltage of the junction.

2. A semiconductor device as in claim 1 wherein said plurality of localized areas occupy less than one percent of the total cross-sectional area of the device.

3. A semiconductor device comprising four successive regions of semiconductive material with contiguous regions being of opposite conductivity type to form three junctions, a center and outer junctions, at least one of the regions forming the center junction having at the junction a plurality of spaced isolated localized areas of higher concentration of unbalanced charges than the remainder of the region whereby the junction formed at said isolated localized areas has a characteristic reverse breakdown voltage which is substantially less than the characteristic reverse breakdown voltage of the remainder of the junction whereby said areas determine the characteristic reverse breakdown voltage of the device.

4. A semiconductor device as in claim 3 wherein said plurality of areas occupy less than one percent of the total cross-sectional area of the device.

5. A semiconductor switching device comprising four successive regions of semiconductive material with contiguous regions being of opposite conductivity type to form three junctions, a center junction and outer junctions, at least one of the regions forming the center junction having a plurality of spaced isolated localized areas of higher concentration of unbalanced charges at the junction than the remainder of the region whereby the switching voltage at the junction defined by said isolated localized areas of the device is substantially less than the switching voltage of the remainder of the junction of the device.

6. A semiconductor device as in claim 5 wherein said areas of said region are inset in the same.

7. A semiconductor device as in claim 5 wherein said areas of said region are formed as islands on said region.

8. A device as in claim 5 wherein the localized areas occupy less than one percent of the total cross-sectional area of the device and the switching voltage at said areas is less than one-tenth the switching voltage of the remainder of the device.

References Cited in the file of this patent

UNITED STATES PATENTS

| | | |
|---|---|---|
| 2,980,830 | Shockley | Apr. 18, 1961 |
| 2,985,804 | Buie | May 23, 1961 |
| 2,995,473 | Levi | Aug. 8, 1961 |
| 3,001,111 | Chappey | Sept. 19, 1961 |

FOREIGN PATENTS

| | | |
|---|---|---|
| 1,037,293 | France | Apr. 29, 1953 |